United States Patent [19]
Mauritz et al.

[11] Patent Number: 4,882,700
[45] Date of Patent: Nov. 21, 1989

[54] SWITCHED MEMORY MODULE

[75] Inventors: Karl H. Mauritz, Eagle; Geary L. Leger, Boise, both of Id.; Joseph B. Wicklund, Bothell, Wash.; James E. Herrud; Steven H. Laney, both of Boise, Id.

[73] Assignee: Micron Technology, Inc., Boise, Id.

[21] Appl. No.: 204,078

[22] Filed: Jun. 8, 1988

[51] Int. Cl.$^4$ ............................................. G11C 13/00
[52] U.S. Cl. ............................... 365/51; 365/189.01; 365/189.04; 365/230.05
[58] Field of Search ............. 365/51, 52, 203, 189.01, 365/189.03, 189.04, 189.05, 230.01, 230.03, 230.05

[56] References Cited

U.S. PATENT DOCUMENTS

| | | |
|---|---|---|
| 3,328,768 | 6/1967 | Amdahl et al. |
| 3,389,380 | 6/1968 | Ashbaugh et al. |
| 3,411,139 | 11/1968 | Lynch et al. |
| 3,413,613 | 11/1968 | Bahrs et al. |
| 3,553,653 | 1/1971 | Krock |
| 3,840,864 | 10/1974 | Chang et al. |
| 3,889,243 | 6/1975 | Drimak |
| 4,025,903 | 5/1977 | Kaufman et al. |

FOREIGN PATENT DOCUMENTS

| | | |
|---|---|---|
| 1116869 | 6/1968 | United Kingdom |
| 1200564 | 7/1970 | United Kingdom |
| 1221640 | 2/1971 | United Kingdom |
| 1288728 | 9/1972 | United Kingdom |

Primary Examiner—Terrell W. Fears
Attorney, Agent, or Firm—Stan Protigal; Angus Fox; Jon Busack

[57] ABSTRACT

A printed circuit board is designed to conform to a single in-line memory module (SIMM) configuration, but includes multiple rows of the memory devices. By controlling a sequence of enable signals, selection of a single row from the multiple row of memory devices can be accomplished. The ability to address the different rows multiplies the memory capacity of the board by the number of rows of memory devices.

22 Claims, 3 Drawing Sheets

SWITCHED MEMORY MODULE

SUMMARY OF THE INVENTION

The invention relates to increasing the memory size of a SIMM by a multiple, for example by a factor of 4.

Logic circuits are included on a circuit board which is used in place of a SIMM board. The logic circuits select between 4 banks of DRAMs on the circuit board. Each bank has a number of DRAMs which correspond to a number of DRAMs (usually 8 or 9) on the SIMM board. Thus, a four bank board would usually have either 32 or 36 DRAMs.

The circuit board is designed to be a plug-in replacement for a SIMM board and can be plugged into the same slot (for example, 30 pins).

DETAILED DESCRIPTION OF THE PREFERRED EMBODIMENT

Figure 1:
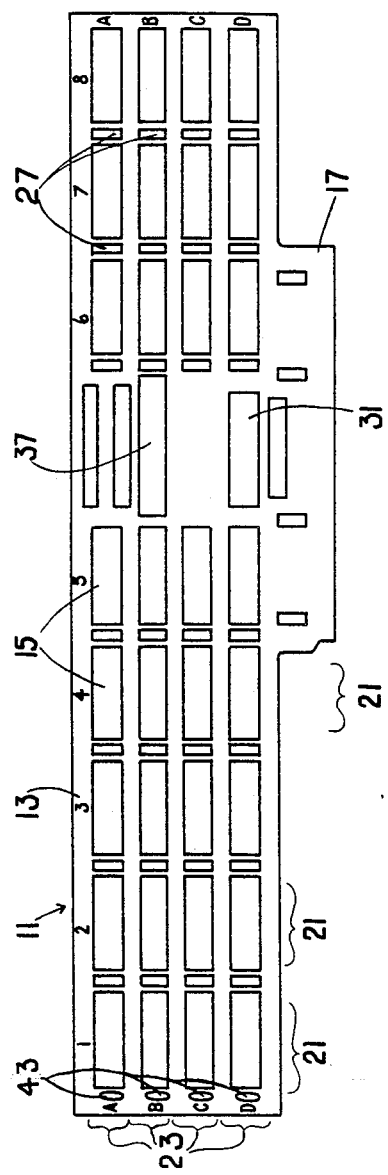
FIG. 1 shows a circuit board configuration constructed in accordance with the present invention.

A memory card 11 in accordance with the preferred embodiment consists of a printed circuit board 13, on which are mounted a plurality of semiconductor memory devices such as DRAMs 15. The printed circuit board 13 includes an edge connector 17, which extends from the printed circuit board 13 in order to permit the card 11 to be plugged into a computer bus (not shown) on a computer. The computer bus has a capability of addressing SIMM (single in-line memory module) boards. The DRAMs 15 are arranged in a plurality of columns 21, identified 1-8 and a plurality of rows 23, marked A-D. The plurality of columns 21 correspond to a like number of columns of a SIMM board for which the computer is designed (usually 8 or 9, but 16, 17, 32 or 33 rows are also likely). The 8 columns 21 are suitable for addressing bytes of 8 bit words, and the rows 23 are switched by a bank select multiplexer 31 in order that byte contained in the DRAMs 15 in each separate row 23 are separately accessed.

The columns 21 and rows 23 are at a higher level grouping than column and row addresses (CAS; RAS) of bits on the individual DRAMs. Selection of of columns 21 and rows 23 is performed as a part of the function of the CAS and RAS addressing, in order that individual bits may be addressed.

Each column 21 is addressed for write information in a predetermined sequence as defined by the SIMM protocol, in which all columns 21 of DRAMs are simultaneously addressed to obtain a byte of information. Individual bits of information on each DRAM 15 are normally addressed discretely. Other addressing schemes are, of course, possible.

Since the number of rows 21 corresponds to the number of rows of a SIMM board for which the computer is designed, the computer's addressing protocol is followed for the row addressing at each bank. In order to increase the total number of columns that may be addressed, column addressing is accomplished by a bank select multiplexer 31 which controls read and write address signals to the DRAMS 15 in each row 23. Since four rows of DRAMS 15 are provided, two address lines can control each bank select function. Therefore, in operation, the multiplexer 31 provides the row address signals along with RAS and CAS signals for addressing individual in the DRAMS 15.

Figure 2:
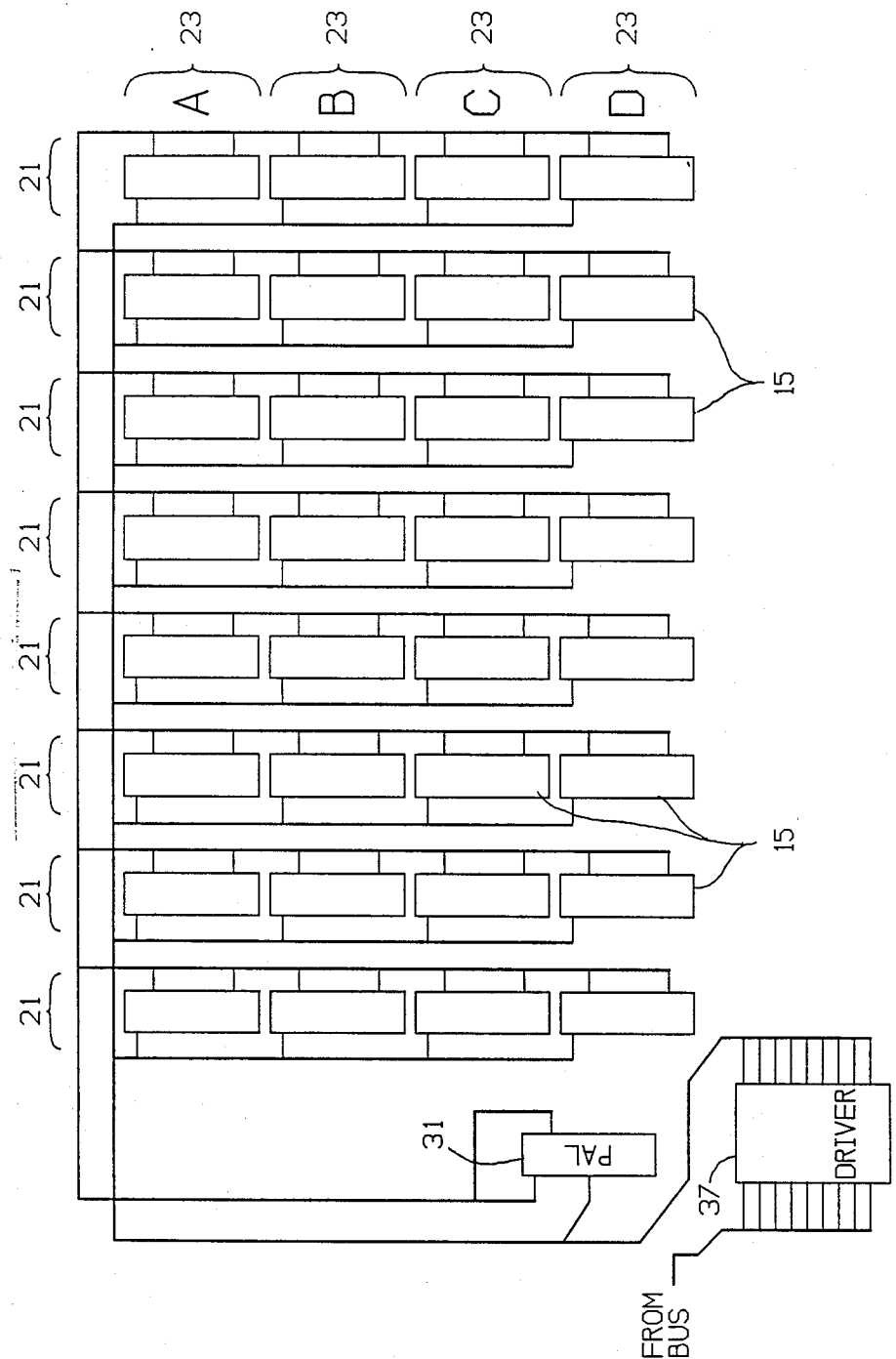
FIG. 2 shows a circuit arrangement for the circuit board of FIG. 1.
Figure 2A:
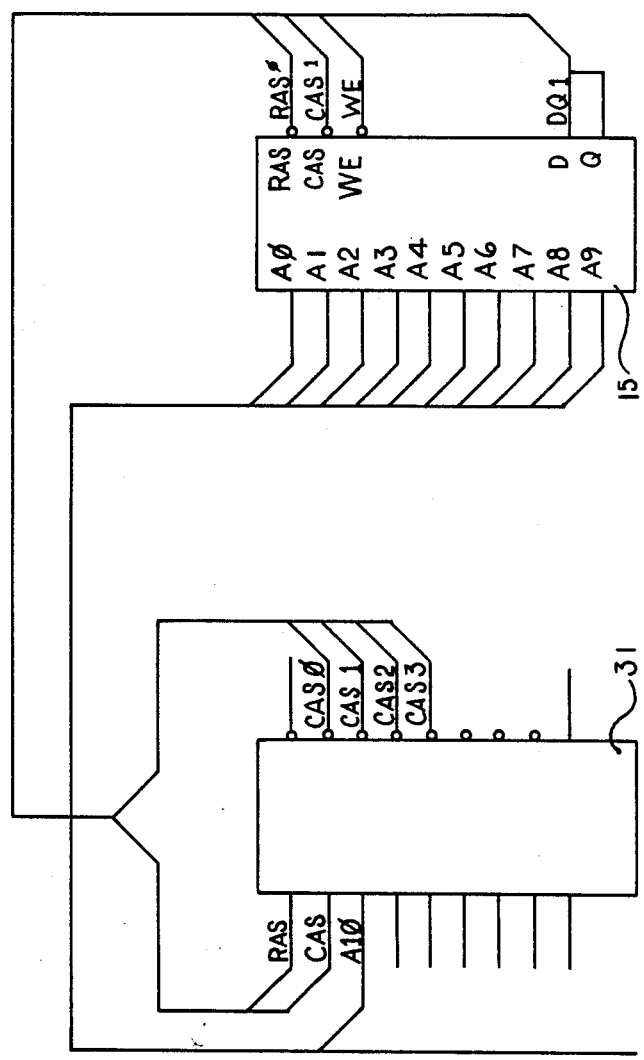
FIG. 2A shows connection details of one of the DRAMS of FIG. 2.

FIG. 2 shows an arrangement of addressing connections, and FIG. 2A shows details of the addressing connections.

In the preferred embodiment, the multiplexer 31 is a programmable array logic (PAL) device, sold by Texas Instruments as a 16L8PAL. In order to provide signal levels adequate to operate the PAL 31 and the DRAMS 15, a driver 37 is used which, in a preferred embodiment, is a Signetics 74F827 address driver, available from Signetics, located in Sunnyvale.

The impedance of the multiple rows 23 of the DRAMs 15 results in a mismatch (of impedance) of multiplexed RAS and CAS signal lines if the signals are intended for use with a single row of DRAMs. In order to cause the impedance to match that of inputs, termination capacitors 43 are used to compensate for the shifted impedance load of the DRAMs caused by the multiple rows 23 of DRAMs 15. The termination capacitors 43, when combined with driver 37 permits the memory card 11 to respond to computer addresss signals at signal levels intended for a single row SIMM board.

What has been described is a specific embodiment of the invention. Four banks of memory devices have been described because two enable lines conveniently allow the selection of any of four units. Additional banks are possible, either by adding enable lines or by using one or more additional signal lines. The invention should work with other memory devices, such as SRAMS and VRAMS, provided that the appropriate pinout protocol is observed. It is anticipated that variations can be made on the preferred embodiment and therefore, the invention should be read as limited only by the claims.

We claim:

1. Method of operating a memory array in which a plurality of memory circuit devices are arranged in a manner such that memory information is obtained by addressing bits of information from a selected number of the memory devices in the array in a format, the devices being addressed by using address enable signals to address each device, and the format of bits form a byte of memory data such that each byte includes bits from each memory device in the selected number of the circuit devices, and wherein the bits are addressed as rows and columns of information in a matrix on each memory device, characterized by:
  (a) arranging the memory devices into a plurality of columns of memory devices, and a plurality of rows of memory devices;
  (b) selectively enabling the addressing of the different rows of the memory devices by selectively providing said address enable signals to the respective rows of the devices, wherein each of a selected number of the memory devices in one row are addressed simultaneously as an address command response and a like number of memory devices in other rows are addressed at different times, the addressing of the different rows of the memory devices being accomplished in like sequences of rows and columns on a plurality of the devices;
  (c) addressing each row of the memory devices while not enabling the memory devices in the other rows to be addressed.

2. Method as described as in claim 1, further characterized by:
(a) addressing each memory device by using addresses which are arranged in similar matrices of rows and columns on the memory device; and
(b) using address commands for addressing of a row of memory devices to corresponding rows and columns on each memory device in a row of memory devices in response to said address commands.

3. Method as described in claim 2, further characterized by:
using one of said memory devices in each row to provide parity information such that a column of the memory devices provides said parity information.

4. Method as described in claim 3, further characterized by:
arranging the memory devices in four rows, wherein two bits of enable data are provided to each memory device, thereby causing selected rows of the memory devices to be enabled by said new bits of information.

5. Method as described in claim 2, further characterized by:
using termination capacitors to compensate for a shifted impedance load of the memory devices caused by the multiple rows of said memory devices, when the multiple rows of said memory devices are provided with computer address signals at signal level intended for a single row of memory devices.

6. Method as described in claim 5, further characterized by:
(a) arranging the memory devices in four rows;
(b) providing two bits of enable data to each memory device, thereby causing selected rows and of the memory devices to be enabled by said new bits of information.

7. Method as described in claim 6, further characterized by:
(a) the memory devices being random access memory semiconductor devices, having read and write address bits thereon;
(b) the two bits being row and column enable bits for the memory devices.

8. Method as described in claim 7, further characterized by:
the memory devices being dynamic random access memories.

9. Method as described in claim 5, further characterized by:
(a) using a computer to provide address signals to an address circuit; and
(b) responding to address signals with the address circuit and addressing the memory devices in a sequence which permits said selective enablement.

10. Method as described in claim 9, further characterized by:
(a) generating the address signals with a driver; and
(b) providing the address signals to said address circuit in response to signals received from the computer.

11. Method as described in claim 9, further characterized by:
(a) said address circuit being a programmable array logic circuit; and
(b) controlling the enablement of memory devices in said memory array with the programable array logic device.

12. Method as described in claim 1, characterized by:
arranging the array on a printed circuit board having an edge connector, wherein the edge connector is insertable into a data bus slot in lieu of a single row of said memory devices.

13. Method as described in claim 12, further characterized by:
(a) arranging addresses on each memory device in similar matrices of rows and columns on the memory device;
(b) the addressing of a row of memory devices being accomplished to corresponding rows and columns on each memory device in a row of memory devices in response to address commands;
(c) responding to address signals received from a computer with an address circuit and addressing the memory devices in a sequence which permits said selective enablement;
(d) providing address signals to said address circuit with a driver, in response to signals received from the computer; and
(e) using termination capacitors to compensate for a shifted impedance load of the memory devices caused by the multiple rows of said memory devices, when the multiple rows of said memory devices are provided with computer address signals at signal levels intended for a single row of memory devices.

14. Method as described in claim 13, further characterized by:
(a) said address circuit being a programmable array logic circuit; and
(b) controlling the enablement of memory devices in said memory array with the programmable array logic device.

15. Method of operating a memory array in which a plurality of memory circuit devices are mounted on a printed circuit board which includes an edge connector for connection to a one-byte memory address bus and bits of information are addressed from a number of the memory devices in the array corresponding to a byte format, wherein the edge connector is insertable into a data bus slot in lieu of a single row of said memory devices, and wherein the bits are addressed as rows and columms of information in a matrix on each memory device, characterized by:
(a) arranging the memory devices into a plurality of columns and a plurality of rows;
(b) selectively enabling the addressing of the different rows of the memory devices, wherein each of a selected number of the memory devices in one row are addressed simultaneously as an address command response and a like number of memory devices on other rows are addressed at different times, the addressing of the different rows of the memory devices being accomplished in like sequences of columns;
(c) addressing each row of the memory devices while not enabling the memory devices in the other rows to be addressed;
(d) providing each memory device with addresses which are arranged in similar matrices of rows and columns on the memory device;
(e) addressing of a row of memory devices to corresponding rows and columns on each memory device in a row of memory devices in response to address commands;

(f) the memory devices being random access memory semiconductor devices, having read and write addess bits thereon;

(g) providing two bits of enable data to each memory device, thereby causing selected rows and columns of the memory devices to be enabled by said new bits of information;

(h) the two bits being row and column enable bits for the memory devices;

(i) responding to address signals received from a computer and addressing the memory devices in a sequence which permits said selective enablement; and (j) providing address signals to said address circuit, in response to signals received from the computer.

16. Method as described in claim 15, further characterized by:

using termination capacitors to compensate for a shifted impedance load of the memory devices caused by the multiple rows of said memory devices, when provided with computer address signals at signal levels intended for a single row SIMM board.

17. Method as described in claim 16, further characterized by:

the memory devices being arranged in four rows, wherein said two bits of enable data are provided to each memory device, thereby enabling selected rows and of the memory devices to be enabled by said new bits of information.

18. Method as described in claim 17, further characterized by:

(a) said address circuit being a programmable array logic circuit; and (b) controlling the enablement of memory devices in said memory array with the programmable array logic device.

19. Method as described in claim 15, further characterized by:

(a) using a computer to provide address signals to an address circuit; and (b) responding to address signals with the address circuit and addressing the memory devices in a sequence which permits said selective enablement.

20. Method as described in claim 19, further characterized by:

(a) generating the address signals with a driver; and (b) providing the address signals to said address circuit in response to signals received from the computer.

21. Method as described in claim 19, further characterized by:

(a) said address circuit being a programmable array logic circuit; and (b) controlling the enablement of memory devices in said memory array with the programmable array logic device.

22. Method as described in claim 19, characterized by:

(a) arranging the array on a printed circuit board having an edge connector, wherein the edge connector is insertable into a data bus slot in lieu of a single row of said memory devices.

* * * * *